United States Patent
Ito et al.

(10) Patent No.: US 8,247,481 B2
(45) Date of Patent: Aug. 21, 2012

(54) PHOTOSENSITIVE INSULATING RESIN COMPOSITION, CURED PRODUCT THEREOF AND ABA BLOCK COPOLYMER

(75) Inventors: Atsushi Ito, Tokyo (JP); Shigehito Asano, Tokyo (JP); Hirofumi Goto, Tokyo (JP); Takayoshi Tanabe, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/072,788

(22) Filed: Mar. 28, 2011

(65) Prior Publication Data

US 2011/0172349 A1    Jul. 14, 2011

Related U.S. Application Data

(63) Continuation of application No. PCT/JP2009/067663, filed on Oct. 9, 2009.

(30) Foreign Application Priority Data

Oct. 27, 2008 (JP) ................................. 2008-276090
Nov. 20, 2008 (JP) ................................. 2008-297266

(51) Int. Cl.
C08L 53/00 (2006.01)
G03F 7/004 (2006.01)
C08F 293/00 (2006.01)

(52) U.S. Cl. .................... 524/114; 524/190; 526/313

(58) Field of Classification Search ................. 524/190, 524/114; 526/313
See application file for complete search history.

(56) References Cited

U.S. PATENT DOCUMENTS 4,243,743 A    1/1981    Hiramoto et al.
(Continued)

FOREIGN PATENT DOCUMENTS

JP    54-145794    11/1979
(Continued)

OTHER PUBLICATIONS

Machine translation of JP 11-080221. Mar. 1999.*

(Continued)

*Primary Examiner* — Ling Choi
*Assistant Examiner* — John Uselding
(74) *Attorney, Agent, or Firm* — Ditthavong Mori & Steiner, P.C.

(57) ABSTRACT

A photosensitive insulating resin composition includes a block copolymer, a crosslinking agent, a photosensitive compound, and a solvent. The block copolymer includes a first structural unit shown by a following formula (1) and a second structural unit shown by a following formula (2),

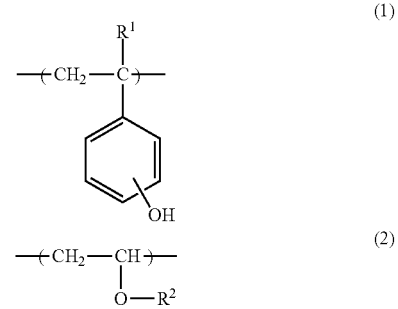

wherein $R^1$ represents a hydrogen atom or an alkyl group having 1 to 4 carbon atoms, and $R^2$ represents an alkyl group having 1 to 4 carbon atoms.

20 Claims, 2 Drawing Sheets

U.S. PATENT DOCUMENTS

| | | | |
|---|---|---|---|
| 5,348,835 A | 9/1994 | Oba et al. | |
| 5,518,864 A | 5/1996 | Oba et al. | |
| 2010/0286351 A1* | 11/2010 | Yoshida et al. | 526/209 |

FOREIGN PATENT DOCUMENTS

| | | | |
|---|---|---|---|
| JP | 3-186847 | | 8/1991 |
| JP | 5-005996 | | 1/1993 |
| JP | 8-050354 | | 2/1996 |
| JP | 11-080221 | * | 3/1999 |
| JP | 2000-098601 | | 4/2000 |
| JP | 2003-215802 | | 7/2003 |
| JP | 2003-342327 | | 12/2003 |
| JP | 2004-240143 | | 8/2004 |
| JP | 2004-240144 | | 8/2004 |
| WO | WO 2009/011186 | | 1/2009 |

OTHER PUBLICATIONS

Machine translation of JP 2003-342327. Dec. 2003.*
Machine translation of JP 2004-240144. Aug. 2004.*
Machine translation of JP 2004-240143. Aug. 2004.*
International Search Report for International Application No. PCT/JP2009/067663, Nov. 2, 2009.

* cited by examiner

PHOTOSENSITIVE INSULATING RESIN COMPOSITION, CURED PRODUCT THEREOF AND ABA BLOCK COPOLYMER

CROSS-REFERENCE TO RELATED APPLICATIONS

The present application is a continuation application of International Application No. PCT/JP2009/067663, filed Oct. 9, 2009, which claims priority to Japanese Patent Application No. 2008-297266, filed Nov. 20, 2008 and Japanese Patent Application No. 2008-276090, filed Oct. 27, 2008. The contents of these applications are incorporated herein by reference in their entirety.

BACKGROUND OF THE INVENTION

1. Field of the Invention

The present invention relates to a photosensitive insulating resin composition, an insulating cured product obtained by curing the photosensitive insulating resin composition, and an ABA block copolymer.

2. Discussion of the Background

A polyimide resin that exhibits excellent heat resistance, mechanical properties, and the like has been widely used as an interlayer dielectric, a surface protective film, and the like of semiconductor devices provided in electronic instruments. Various photosensitive polyimide resins exhibiting photosensitivity have been studied in order to improve the productivity, the film-forming accuracy, and the like. For example, Japanese Patent Application Publication (KOKAI) No. 5-5996 discloses a negative-tone resin in which a photo-crosslinkable group is introduced into a polyimide precursor via an ester bond or an ionic bond, and Japanese Patent Application Publication (KOKAI) No. 2000-98601 discloses a positive-tone resin that contains a polyimide precursor and an o-quinone diazide compound.

Along with an increase in the degree of integration of semiconductor devices, various photosensitive polyimide resins have been proposed in order to improve the film-forming accuracy. For example, Japanese Patent Application Publication (KOKAI) No. 54-145794 discloses a composition that contains a photosensitive polyimide resin in which a photo-crosslinkable group is introduced into a polyimide precursor via an ionic bond, and Japanese Patent Application Publication (KOKAI) No. 3-186847 discloses a composition that contains a photosensitive polyimide resin in which a photo-crosslinkable group is introduced into a polyimide precursor via an ester bond. Japanese Patent Application Publication (KOKAI) No. 8-50354 discloses a negative-tone photosensitive composition that contains an aromatic polyimide precursor and a polyfunctional acrylic compound. As a composition that does not contain a polyimide, Japanese Patent Application Publication (KOKAI) No. 2003-215802 discloses a photosensitive insulating resin composition that contains a phenolic hydroxyl group-containing alkali-soluble resin, a crosslinking agent, and a photoacid generator.

SUMMARY OF THE INVENTION

According to one aspect of the present invention, a photosensitive insulating resin composition includes a block copolymer, a crosslinking agent, a photosensitive compound, and a solvent. The block copolymer includes a first structural unit shown by a following formula (1) and a second structural unit shown by a following formula (2), wherein $R^1$ represents a hydrogen atom or an alkyl group having 1 to 4 carbon atoms, and $R^2$ represents an alkyl group having 1 to 4 carbon atoms.

According to another aspect of the present invention, a cured product is obtained by curing the above-mentioned photosensitive insulating resin composition.

According to further aspect of the present invention, an ABA block copolymer includes a first block including a first structural unit shown by a following formula (1) and a second block including a second structural unit shown by a following formula (2). The first block is bonded to each end of the second block, wherein $R^1$ represents a hydrogen atom or an alkyl group having 1 to 4 carbon atoms, and $R^2$ represents an alkyl group having 1 to 4 carbon atoms.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments of the invention is described in detail below with reference to the accompanying drawings, wherein like reference numerals designate corresponding or identical elements throughout the various drawings. Note that the term "(meth)acryl" used herein refers to "acryl" or "methacryl". The term "(meth)acrylate" used herein refers to "acrylate" or "methacrylate".

[1] Photosensitive Insulating Resin Composition

A photosensitive insulating resin composition (hereinafter may be referred to as "resin composition") according to one embodiment of the invention includes (A) a block copolymer that includes (a1) a structural unit shown by the formula (1), and (a2) a structural unit shown by the formula (2), (B) a crosslinking agent, (C) a photosensitive compound, and (D) a solvent.

Block Copolymer (A)

The block copolymer (A) is an alkali-soluble resin, and includes the structural unit (a1) shown by the formula (1), and the structural unit (a2) shown by the formula (2). The structural unit (a1) is a hydroxystyrene unit or a hydroxystyrene alkyl derivative unit (wherein the alkyl group is a methyl group, an ethyl group, a propyl group, or a butyl group; when the alkyl group is a propyl group or a butyl group, the alkyl group may be linear or branched), and the structural unit (a2) is an alkyl vinyl ether unit (wherein the alkyl group is a methyl group, an ethyl group, a propyl group, or a butyl group; when the alkyl group is a propyl group or a butyl group, the alkyl group may be linear or branched).

The block copolymer (A) may be an ABA block copolymer in which a block including the structural unit (a1) or a block including the structural unit (a2) is bonded to each end of the other block, or may be an AB block copolymer in which a block including the structural unit (a1) or a block including the structural unit (a2) is bonded to one end of the other block. The block copolymer (A) is preferably an ABA block copolymer due to excellent resolution. The block copolymer (A) is normally an ABA block copolymer in which a block including the structural unit (a1) is bonded to each end of a block including the structural unit (a2).

Examples of a monomer used to produce the structural unit (a1) include 4-hydroxystyrene, 4-hydroxy-α-methylstyrene, and the like.

Examples of a monomer used to produce the structural unit (a2) include methyl vinyl ether, ethyl vinyl ether, n-propyl vinyl ether, i-propyl vinyl ether, n-butyl vinyl ether, t-butyl vinyl ether, and the like.

The ratio of the structural unit (a1) to the structural unit (a2) included in the block copolymer (A) is not particularly limited. It is preferable that the content of the structural unit (a1) be 40 to 60 mol %, and more preferably 45 to 55 mol %, based on the total amount (=100 mol %) of the structural unit (a1) and the structural unit (a2). It is preferable that the content of the structural unit (a2) be 40 to 60 mol %, and more preferably 45 to 55 mol %.

The polystyrene-reduced weight average molecular weight of the block copolymer (A) determined by gel permeation chromatography is not particularly limited, but is preferably 10,000 or more, more preferably 10,000 to 50,000, and still more preferably 10,000 to 30,000, so that the resulting insulating film exhibits excellent resolution, thermal shock resistance, heat resistance, residual ratio, and the like.

The content of the block copolymer (A) in the photosensitive insulating resin composition is not particularly limited, but is preferably 30 to 90 mass %, and more preferably 40 to 80 mass %, based on the total amount (=100 mass %) of the components excluding the solvent (D). If the content of the block copolymer (A) is 30 to 90 mass %, an insulating film formed using the photosensitive insulating resin composition exhibits sufficient developability in an alkaline aqueous solution.

The resin composition may further include a phenolic low-molecular-weight compound. Examples of the phenolic low-molecular-weight compound include 4,4'-dihydroxydiphenylmethane, 4,4'-dihydroxy diphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methyethyl]-1,3-dihydroxybenzene, 1,1-bis(4-hydroxyphenyl)-1-[4-(1-(4-hydroxyphenyl)-1-methylethyl)phenyl]ethane, 1,1,2,2-tetra(4-hydroxyphenyl)ethane, and the like. These phenolic low-molecular-weight compounds may be used either individually or in combination.

The phenolic low-molecular-weight compound is preferably used in an amount of 40 parts by mass or less, and more preferably 1 to 30 parts by mass, based on 100 parts by mass of the block copolymer (A).

The block copolymer (A) may be produced by living cationic polymerization or living radical polymerization.

When producing the block copolymer (A) by living cationic polymerization, 4-hydroxystyrene is subjected to cationic polymerization in an appropriate polymerization solvent in the presence of a cationic polymerization catalyst to produce a cationic living polymer of 4-hydroxystyrene, for example. The cationic living polymer is copolymerized with ethyl vinyl ether to produce a block copolymer.

As the polymerization solvent, a halogenated hydrocarbon solvent (e.g., methylene chloride or chlorobenzene), an ether solvent (e.g., dibutyl ether, diphenyl ether, dioxane, or tetrahydrofuran), a highly polar solvent (e.g., acetonitrile or nitrobenzene), or the like may be used. As the cationic polymerization catalyst, $HI-ZnI_2$, $I_2$, $I_2-HI$, a catalyst that includes a Lewis acid and a base (e.g., metal halide-ether complex), or the like may be used. The cationic polymerization catalyst may be used in an amount of 0.01 to 0.00001 mol based on 1 mol of 4-hydroxystyrene or the like. The reaction temperature may be −150 to 50° C., for example.

When producing the block copolymer (A) by living radical polymerization, ethyl vinyl ether is subjected to radical polymerization in an appropriate polymerization solvent in the presence of a radical polymerization catalyst to produce a radical living polymer of ethyl vinyl ether, for example. The radical living polymer is copolymerized with 4-hydroxystyrene to produce a block copolymer.

As the polymerization solvent, an amide solvent (e.g., dimethylformamide, dimethylacetamide, or N-methylpyrrolidone), a hydrocarbon solvent (e.g., benzene, toluene, xylene, hexane, or cyclohexane), an ester solvent (e.g., γ-butyrolactone or ethyl lactate), a ketone solvent (e.g., cyclohexylbenzophenone or cyclohexanone), or the like may be used. As the radical polymerization catalyst, a catalyst system that includes a peroxide and an N-oxy radical (e.g., 4-methylsulfonyloxy-2,2',6,6'-tetramethyl-1-piperidine-N-oxide, 2,2',5,5'-tetramethylpyrrolidine oxide, or 4-oxo-2,2',6,6'-tetramethyl-1-piperidine-N-oxide), a sulfide system catalyst, or the like may be used. The radical polymerization catalyst may be used in an amount of 0.01 to 0.00001 mol based on 1 mol of the monomer. The reaction temperature is determined depending on the energy required for the end-protected living group to cleave, and may be 60 to 200° C., for example.

Crosslinking Agent (B)

The crosslinking agent (B) is not particularly limited insofar as the crosslinking agent (B) undergoes a crosslinking reaction optionally with another component (e.g., polymer (A)) due to external stimulation (e.g., heat or acid) to form a three-dimensional crosslinked structure.

When the photosensitive insulating resin composition according to one embodiment of the invention is a negative-tone resin composition, the crosslinking agent (B) is preferably at least one compound (hereinafter may be referred to as "crosslinking agent (B1)") selected from (b1) a compound that includes two or more alkyl-etherified amino groups in its molecule (hereinafter referred to as "amino group-containing compound"), (b2) an oxirane ring-containing compound, and (b3) an oxetanyl ring-containing compound.

Examples of the amino group-containing compound (b1) include, but are not limited to, a compound obtained by alkyl-etherification of all or some (at least two) of the active methylol groups ($CH_2OH$ groups) of a nitrogen-containing compound (e.g., (poly)methylol melamine, (poly)methylol glycoluril, (poly)methylol benzoquanamine, or (poly)methylol urea). Examples of the alkyl group included in the alkyl ether include a methyl group, an ethyl group, and a butyl group. The alkyl groups may be either the same or different. A methylol group that is not alkyl-etherified may be self-condensed within one molecule, or may be condensed across two molecules to form an oligomer component. Specifically, hexamethoxymethyl melamine, hexabutoxymethyl melamine, tetramethoxymethyl glycoluril, tetrabutoxymethyl glycoluril, or the like may be used.

The oxirane ring-containing compound (b2) is not particularly limited insofar as the compound includes an oxirane ring in the molecule. Examples of the oxirane ring-containing compound (b2) include a phenol novolac epoxy resin, a cresol novolac epoxy resin, a bisphenol epoxy resin, a trisphenol epoxy resin, a tetraphenol epoxy resin, a phenol-xylylene epoxy resin, a naphthol-xylylene epoxy resin, a phenol-naphthol epoxy resin, a phenol-dicyclopentadiene epoxy resin, an alicyclic epoxy resin, an aliphatic epoxy resin, and the like.

The oxetanyl ring-containing compound (b3) is not particularly limited insofar as the compound includes an oxetanyl ring in the molecule. Examples of the oxetanyl ring-containing compound (b3) include compounds shown by the following general formula (b3-1), compounds shown by the following general formula (b3-2), compounds shown by the following general formula (b3-3), and the like.

wherein $R^3$ represents an alkyl group (e.g., methyl group, ethyl group, or propyl group), $R^4$ represents an alkylene group (e.g., methylene group, ethylene group, or propylene group), $R^5$ represents an alkyl group (e.g., methyl group, ethyl group, propyl group, or hexyl group), an aryl group (e.g., phenyl group or xylyl group), a dimethylsiloxane residue shown by the following formula (i), an alkylene group (e.g., methylene group, ethylene group, or propylene group), a phenylene group, or any of the groups shown by the following formulas (ii) to (vi), and i is equal to the valence of $R^5$ (i.e., an integer from 1 to 4).

x and y in the formulas (i) and (ii) are individually an integer from 0 to 50.

Z in the formula (iii) represents a single bond or a divalent group shown by $-CH_2-$, $-C(CH_3)_2-$, $-C(CF_3)_2-$, or $-SO_2-$.

Specific examples of the compounds shown by the formulas (b3-1) to (b3-3) include 1,4-bis{[(3-ethyloxetane-3-yl)methoxy]methyl}benzene ("OXT-121" manufactured by Toagosei Co., Ltd.), 3-ethyl-3-{[(3-ethyloxetane-3-yl)methoxy]methyl}oxetane ("OXT-221" manufactured by Toagosei Co., Ltd.), bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoropropane, tri[(3-ethyl-3-oxetanylmethoxy)methyl]benzene, tetra[(3-ethyl-3-oxetanylmethoxy)methyl]benzene, compounds shown by the following formulas (b3-4) and (b3-6) to (b3-8), and the like.

(b3-4)

(b3-6)

(b3-7)

(b3-8)

A high-molecular-weight compound that includes a polyvalent oxetane ring may also be used. Examples of such a compound include an oxetane oligomer ("Oligo-OXT" manufactured by Toagosei Co., Ltd.), compounds shown by the following formulas (b3-9) to (b3-11), and the like.

(b3-9)

(b3-10)

(b3-11)

wherein p, q, and s are individually an integer from 0 to 10,000.

Among these oxetanyl ring-containing compounds (b3), 1,4-bis{[(3-ethyloxetane-3-yl)methoxy]methyl}benzene ("OXT-121" manufactured by Toagosei Co., Ltd.), and 3-ethyl-3-{[(3-ethyloxetane-3-yl)methoxy]methyl}oxetane ("OXT-221" manufactured by Toagosei Co., Ltd.) are preferable.

It is preferable to use the amino group-containing compound (b1) or the oxirane ring-containing compound (b2) as the crosslinking agent (B1). It is more preferable to use the amino group-containing compound (b1) and the oxirane ring-containing compound (b2) in combination as the crosslinking agent (B1). When using the amino group-containing compound (b1) and the oxirane ring-containing compound (b2) in combination, the oxirane ring-containing compound (b2) is preferably used in an amount of 50 mass % or less, and more preferably 5 to 40 mass %, based on the total amount (=100 mass %) of the amino group-containing compound (b1) and the oxirane ring-containing compound (b2). In this case, a cured product (e.g., insulating film) that exhibits high resolution and excellent chemical resistance can be obtained.

The content of the crosslinking agent (B1) is preferably 1 to 100 parts by mass, and more preferably 5 to 50 parts by mass, based on 100 parts by mass of the block copolymer (A). If the content of the crosslinking agent (B1) is 1 to 100 parts by mass, a curing reaction proceeds sufficiently so that the resulting insulating film has an excellent pattern shape with high resolution, and exhibits excellent heat resistance, electrical insulating properties, and the like.

When the photosensitive insulating resin composition according to one embodiment of the invention is a positive-tone resin composition, the crosslinking agent (B) is preferably at least one compound (hereinafter may be referred to as "crosslinking agent (B2)") selected from the amino group-containing compound (b1), the oxirane ring-containing compound (b2), the oxetanyl ring-containing compound (b3), an isocyanate group-containing compound (including a block compound), an aldehyde group-containing phenol compound, and a methylol group-containing phenol compound.

These crosslinking agents (B2) may be used either individually or in combination.

It is preferable to use the amino group-containing compound (b1), the oxirane ring-containing compound (b2), o-hydroxybenzaldehyde, 2,6-bis(hydroxymethyl)-p-cresol, hexamethoxymethylmelamine, or the like as the crosslinking agent (B2).

The amino group-containing compound (b1) and the oxirane ring-containing compound (b2) may be used in combination as the crosslinking agent (B2). When using the amino group-containing compound (b1) and the oxirane ring-containing compound (b2) in combination, the oxirane ring-containing compound (b2) is preferably used in an amount of 50 mass % or less, and more preferably 5 to 40 mass %, based on the total amount (=100 mass %) of the amino group-containing compound (b1) and the oxirane ring-containing compound (b2). In this case, a cured product that exhibits high resolution and excellent chemical resistance can be obtained.

The content of the crosslinking agent (B2) is preferably 1 to 100 parts by mass, and more preferably 5 to 50 parts by mass, based on 100 parts by mass of the block copolymer (A). If the content of the crosslinking agent (B2) is 1 to 100 parts by mass, a curing reaction proceeds sufficiently so that the resulting insulating film has an excellent pattern shape with high resolution, and exhibits excellent heat resistance, electrical insulating properties, and the like.

Photosensitive Compound (C)

The photosensitive compound (C) is not particularly limited insofar as the photosensitive compound (C) is a compound (acid generator) that generates an acid upon exposure to radiation or the like.

Examples of the photosensitive compound (C) when the photosensitive insulating resin composition according to one embodiment of the invention is a negative-tone resin composition include onium salt compounds, halogen-containing compounds, diazoketone compounds, sulfone compounds, sulfonic acid compounds, sulfonimide compounds, diazomethane compounds, and the like (hereinafter may be referred to as "photoacid generator (C1)" or "acid generator (C1)").

The photoacid generator (C1) generates an acid upon exposure to radiation or the like. The acid generated by the photoacid generator (C1) catalyzes a reaction (including dealcoholization) of an alkyl ether group included in the crosslinking agent (B1) with a phenol ring included in the block copolymer (A) or the phenolic low-molecular-weight compound, so that a negative-tone pattern is formed.

Examples of the onium salt compounds include an iodonium salt, a sulfonium salt, a phosphonium salt, a diazonium salt, a pyridinium salt, and the like. Specific examples of preferable onium salts include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-t-butylphenyl·diphenylsulfonium trifluoromethanesulfonate, 4-t-butylphenyl·diphenylsulfonium p-toluenesulfonate, 4,7-di-n-butoxynaphthyltetrahydrothiophenium trifluoromethanesulfonate, and the like.

Examples of the halogen-containing compounds include haloalkyl group-containing hydrocarbon compounds, haloalkyl group-containing heterocyclic compounds, and the like. Specific examples of preferable halogen-containing compounds include 1,10-dibromo-n-decane, 1,1-bis(4-chlorophenyl)-2,2,2-trichloroethane, s-triazine derivatives such as phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine, and the like.

Examples of the diazoketone compounds include 1,3-diketo-2-diazo compounds, diazobenzoquinone compounds, and diazonaphthoquinone compounds. Specific examples of the diazoketone compounds include a 1,2-naphthoquinonediazido-4-sulfonate compound of a phenol, and the like.

Examples of the sulfone compounds include a β-ketosulfone compound, a β-sulfonylsulfone compound, an α-diazo compound of these compounds, and the like. Specific examples of the sulfone compounds include 4-trisphenacylsulfone, mesitylphenacylsulfone, bis(phenacylsulfonyl)methane, and the like.

Examples of the sulfonic acid compounds include alkyl sulfonates, haloalkyl sulfonates, aryl sulfonates, iminosulfonates, and the like. Specific examples of preferable sulfonic acid compounds include benzointocylate, pyrogallol tristrifluoromethanesulfonate, o-nitrobenzyl trifluoromethanesulfonate, o-nitrobenzyl p-toluenesulfonate, and the like.

Specific examples of the sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxylmide, N-(trifluoromethylsulfonyloxy)naphthylimide, and the like.

Specific examples of the diazomethane compounds include bis(trifluoromethylsulfonyl)diazomethane, bis(cyclohexylsulfonyl)diazomethane, bis(phenylsulfonyl)diazomethane, and the like.

It is preferable to use the onium salt compound as the acid generator (C1). It is more preferable to use a hydroxyl group-containing onium salt compound as the acid generator (C1).

These acid generators (C1) may be used either individually or in combination.

The content of the acid generator (C1) is preferably 0.1 to 10 parts by mass, and more preferably 0.3 to 5 parts by mass, based on 100 parts by mass of the block copolymer (A) (or 100 parts by mass of the block copolymer (A) and the phenolic low-molecular-weight compound), so that the negative-tone photosensitive insulating resin composition exhibits sufficient sensitivity, resolution, pattern shape, and the like. If the content of the acid generator (C1) is less than 0.1 parts by mass, the composition may not be cured sufficiently, so that the heat resistance may deteriorate. If the content of the acid generator (C1) exceeds 10 parts by mass, the pattern shape may deteriorate due to a decrease in radiation transmittance.

When the photosensitive insulating resin composition according to one embodiment of the invention is a positive-tone resin composition, a quinone diazide group-containing compound (hereinafter may be referred to as "quinone diazide group-containing compound (C2)") is preferably used as the photosensitive compound (C).

The quinone diazide group-containing compound (C2) is an ester compound of a compound that includes at least one phenolic hydroxyl group and 1,2-naphthoquinonediazido-4-sulfonic acid or 1,2-naphthoquinonediazido-5-sulfonic acid.

The compound that includes at least one phenolic hydroxyl group is not particularly limited, but is preferably a compound having a structure shown by any of the following formulas (3) to (7).

(3)

wherein $X^1$ to $X^{10}$ individually represent a hydrogen atom, an alkyl group having 1 to 4 carbon atoms, an alkoxy group having 1 to 4 carbon atoms, or a hydroxyl group, provided that at least one of $X^1$ to $X^5$ represents a hydroxyl group, and A represents a single bond, O, S, $CH_2$, $C(CH_3)_2$, $C(CF_3)_2$, $C=O$, or $SO_2$.

(4)

wherein $X^{11}$ to $X^{24}$ individually represent a hydrogen atom, an alkyl group having 1 to 4 carbon atoms, an alkoxy group having 1 to 4 carbon atoms, or a hydroxyl group, provided that at least one of $X^{11}$ to $X^{15}$ represents a hydroxyl group, and $R^{11}$ to $R^{14}$ individually represent a hydrogen atom or an alkyl group having 1 to 4 carbon atoms.

(5)

wherein $X^{25}$ to $X^{39}$ individually represent a hydrogen atom, an alkyl group having 1 to 4 carbon atoms, an alkoxy group having 1 to 4 carbon atoms, or a hydroxyl group, provided that at least one of $X^{25}$ to $X^{29}$ and at least one of $X^{30}$ to $X^{34}$ represents a hydroxyl group, and $R^{15}$ represents a hydrogen atom or an alkyl group having 1 to 4 carbon atoms.

(6)

wherein $X^{40}$ to $X^{58}$ individually represent a hydrogen atom, an alkyl group having 1 to 4 carbon atoms, an alkoxy group having 1 to 4 carbon atoms, or a hydroxyl group, provided that at least one of $X^{40}$ to $X^{44}$, at least one of $X^{45}$ to $X^{49}$, and at least one of $X^{50}$ to $X^{54}$ represent a hydroxyl group, and $R^{16}$ to $R^{18}$ individually represent a hydrogen atom or an alkyl group having 1 to 4 carbon atoms.

(7)

wherein $X^{59}$ to $X^{72}$ individually represent a hydrogen atom, an alkyl group having 1 to 4 carbon atoms, an alkoxy group having 1 to 4 carbon atoms, or a hydroxyl group, provided that at least one of $X^{59}$ to $X^{62}$ and at least one of $X^{63}$ to $X^{67}$ represent a hydroxyl group.

Specific examples of the quinone diazide group-containing compound (C2) include an ester compound of 1,2-naphthoquinonediazido-4-sulfonic acid or 1,2-naphthoquinonediazido-5-sulfonic acid and 4,4'-dihydroxydiphenylmethane, 4,4'-dihydroxydiphenyl ether, 2,3,4-trihydroxybenzophenone, 2,3,4,4'-tetrahydroxybenzophenone, 2,3,4,2',4'-pentahydroxybenzophenone, tris(4-hydroxyphenyl)methane, tris(4-hydroxyphenyl)ethane, 1,1-bis(4-hydroxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, or the like. These quinone diazide group-containing compounds (C2) may be used either individually or in combination.

The content of the quinone diazide group-containing compound (C2) is not particularly limited, but is preferably 10 to 50 parts by mass, and more preferably 15 to 30 parts by mass, based on 100 parts by mass of the block copolymer (A). If the content of the quinone diazide group-containing compound (C2) is less than 10 parts by mass, the residual ratio may decrease in the unexposed area, or an image conforming to the mask pattern may not be formed. If the content of the quinone diazide group-containing compound (C2) exceeds 50 parts by mass, the pattern shape may deteriorate, or foaming may occur during curing.

Solvent (D)

The solvent (D) included in the photosensitive insulating resin composition improves the handling capability of the resin composition, and adjusts the viscosity and the storage stability of the resin composition. Examples of the solvent (D) include, but are not limited to, ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; cellosolves such as ethyl cellosolve and butyl cellosolve; carbitols such as butyl carbitol; lactates such as methyl lactate, ethyl lactate, n-propyl lactate, and isopropyl lactate; aliphatic carboxylates such as ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as methyl 3-methoxypropionate, ethyl 3-methoxypropionate, methyl 3-ethoxypropionate, ethyl 3-ethoxypropionate, methyl pyruvate, and ethyl pyruvate; aromatic hydrocarbons such as toluene and xylene; ketones such as 2-heptanone, 3-heptanone, 4-heptanone, and cyclohexanone; amides such as N-dimethylformamide, N-methylacetamide, N,N-dimethylacetamide, and N-methylpyrrolidone; lactones such as γ-butyrolactone; and the like. These solvents may be used individually or in combination.

Adhesion Improver (E)

The photosensitive insulating resin composition may further include (E) an adhesion improver that improves adhesion to a substrate. Examples of the adhesion improver (E) include functional silane coupling agents including a reactive substituent (e.g., carboxyl group, methacryloyl group, isocyanate group, or epoxy group), and the like. Specific examples of the adhesion improver (E) include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, 1,3,5-N-tris(trimethoxysilylpropyl)isocyanurate, and the like. These adhesion improvers may be used individually or in combination.

The content of the adhesion improver (E) is not particularly limited, but is preferably 0.2 to 10 parts by mass, and more preferably 0.5 to 8 parts by mass, based on 100 parts by mass of the block copolymer (A). If the content of the adhesion improver (E) is 0.2 to 10 parts by mass, the resulting resin composition exhibits excellent storage stability and excellent adhesion.

Crosslinked Particles (F)

The photosensitive insulating resin composition may further include (F) crosslinked particles that improve the durability, the thermal shock resistance, and the like of the resulting cured product.

When the photosensitive insulating resin composition according to one embodiment of the invention is a negative-tone resin composition, the crosslinked particles (F) (the crosslinked particles (F) used for the negative-tone resin composition may be referred to as "crosslinked particles (F1)") are not particularly limited insofar as a polymer that forms the crosslinked particles (F) has a glass transition temperature (Tg) of 0° C. or less.

For example, it is preferable to use a copolymer of a crosslinkable monomer including two or more unsaturated polymerizable groups (hereinafter simply referred to as "crosslinkable monomer") and at least one monomer that is selected so that the crosslinked particles (F) have a Tg of 0° C. or less. It is more preferable to use a copolymer of the crosslinkable monomer and two or more monomers other than the crosslinkable monomer, at least one of the monomers other than the crosslinkable monomer including a functional group other than a polymerizable group (e.g., carboxyl group, epoxy group, amino group, isocyanate group, and hydroxyl group).

Examples of the crosslinkable monomer include compounds including a plurality of polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate, and polypropylene glycol di(meth)acrylate. Among these, divinylbenzene is preferable.

The amount of the crosslinkable monomers used when producing the crosslinked particles (F) is preferably 1 to 20 mass %, and more preferably 2 to 10 mass %, based on 100 mass % of the total amount of the monomers used for copolymerization.

Examples of monomers other than the crosslinkable monomer include diene compounds such as butadiene, isoprene, dimethylbutadiene, chloroprene, and 1,3-pentadiene; unsaturated nitrile compounds such as (meth)acrylonitrile, α-chloroacrylonitrile, α-chloromethylacrylonitrile, α-methoxyacrylonitrile, α-ethoxyacrylonitrile, crotonitrile, cinnamonitrile, itaconitrile, maleonitrile, and fumaronitrile; unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonamide, and cinnamamide; (meth)acrylate compounds such as methyl(meth)acrylate, ethyl(meth)acrylate, propyl(meth)acrylate, butyl(meth)acrylate, hexyl(meth)acrylate, lauryl (meth)acrylate, polyethylene glycol (meth)acrylate, and polypropylene glycol (meth)acrylate; aromatic vinyl compounds such as styrene, α-methylstyrene, o-methoxystyrene, p-hydroxystyrene, and p-isopropenylphenol; epoxy group-containing unsaturated compounds such as an epoxy (meth)acrylate obtained by reacting a diglycidyl ether of bisphenol A, diglycidyl ether of glycol, or the like and (meth)acrylic acid, hydroxyalkyl(meth)acrylate, or the like, a urethane (meth)acrylate obtained by reacting hydroxyalkyl (meth)acrylate and polyisocyanate, glycidyl(meth)acrylate, and (meth)allyl glycidyl ether; unsaturated acid compounds such as (meth)acrylic acid, itaconic acid, β-(meth)acryloxyethyl succinate, β-(meth)acryloxyethyl maleate, β-(meth)acryloxyethyl phthalate, and β-(meth)acryloxyethyl hexahydrophthalate; amino group-containing unsaturated compounds such as dimethylamino (meth)acrylate and diethylamino(meth)acrylate; amide group-containing unsaturated compounds such as (meth)acrylamide and dimethyl (meth)acrylamide; hydroxyl group-containing unsaturated compounds such as hydroxyethyl(meth)acrylate, hydroxypropyl(meth)acrylate, and hydroxybutyl(meth)acrylate; and the like.

Among these, butadiene, isoprene, (meth)acrylonitrile, alkyl(meth)acrylates, styrene, p-hydroxystyrene, p-isopropenylphenol, glycidyl(meth)acrylate, (meth)acrylic acid, hydroxyalkyl(meth)acrylates, and the like are preferable.

It is preferable to use at least one diene compound (particularly butadiene) when producing the crosslinked particles (F) as a monomer other than the crosslinkable monomer. The diene compound is preferably used in an amount of 20 to 80 mass %, and more preferably 30 to 70 mass %, based on the total amount (=100 mass %) of the monomers used for copolymerization. If the amount of the diene compound is 20 to 80 mass %, soft and rubbery crosslinked particles (F) are obtained. This prevents a situation in which cracks occur in the resulting cured product (e.g., insulating film), so that an insulating film or the like that exhibits excellent durability can be obtained.

These crosslinked particles (F1) may be used either individually or in combination.

The average particle diameter of the crosslinked particles (F1) is normally 30 to 500 nm, preferably 40 to 200 nm, and more preferably 50 to 120 nm. The particle diameter of the crosslinked particles (F) may be adjusted (controlled) by an arbitrary method. For example, when synthesizing the crosslinked particles by emulsion polymerization, the particle diameter of the crosslinked particles may be adjusted by controlling the number of micelles during emulsion polymerization by adjusting the amount of emulsifier.

The average particle size of the crosslinked particles (F1) refers to a value determined by diluting a dispersion of the crosslinked particles by a known method, and measuring the particle size of the crosslinked particles using a light scattering particle size analyzer ("LPA-3000" manufactured by Otsuka Electronics Co., Ltd.).

The content of the crosslinked particles (F1) is preferably 0.5 to 50 parts by mass, and more preferably 1 to 30 parts by mass, based on 100 parts by mass of the block copolymer (A). If the content of the crosslinked particles (F1) is 0.5 to 50 parts by mass, the crosslinked particles (F1) exhibit excellent dispersibility or mutual solubility with other components, and the thermal shock resistance and the heat resistance of the resulting insulating film or the like can be improved.

When the photosensitive insulating resin composition according to one embodiment of the invention is a positive-tone resin composition, the crosslinked particles (F) (the crosslinked particles (F) used for the positive-tone resin composition may be referred to as "crosslinked particles (F2)") are not particularly limited. Crosslinked particles of a copolymer of a monomer that includes a hydroxyl group and/or a carboxyl group and a crosslinkable monomer that includes two or more unsaturated polymerizable groups (crosslinkable monomer) are normally used as the crosslinked particles (F2). The above copolymer may have been copolymerized with an additional monomer.

Examples of the monomer that includes a hydroxyl group and/or a carboxyl group include hydroxyl group-containing unsaturated compounds such as hydroxyethyl (meth)acrylate, hydroxypropyl(meth)acrylate, and hydroxybutyl(meth) acrylate, unsaturated acid compounds such as (meth)acrylic acid, itaconic acid, β-(meth)acryloxyethyl succinate, β-(meth)acryloxyethyl maleate, β-(meth)acryloxyethyl phthalate, and β-(meth)acryloxyethyl hexahydrophthalate, and the like. These monomers may be used either individually or in combination.

The content (calculated from the acid value and the hydroxyl value measured in accordance with JIS K 0070) of the structural unit derived from the monomer that includes a hydroxyl group and/or a carboxyl group in the crosslinked particles (F2) is 20 to 90 mol %, preferably 20 to 70 mol %, and more preferably 20 to 50 mol %, based on the total content (=100 mol %) of the structural units derived from the monomers. If the content of the structural unit derived from the monomer that includes a hydroxyl group and/or a carboxyl group is less than 20 mol %, dispersibility in an alkaline developer may be insufficient, so that the patterning capability may deteriorate. If the content of the structural unit derived from the monomer that includes a hydroxyl group and/or a carboxyl group exceeds 90 mol %, cracks may occur in the resulting cured film, or the cured film may exhibit decreased elongation.

Examples of the crosslinkable monomer include compounds including a plurality of polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri (meth)acrylate, polyethylene glycol di(meth)acrylate, and polypropylene glycol di(meth)acrylate. Among these, divinylbenzene is preferable. These crosslinkable monomers may be used individually or in combination.

The content of the structural unit derived from the crosslinkable monomer in the crosslinked particles (F2) is preferably 1 to 20 mol %, and more preferably 1 to 10 mol %, based on the total amount (=100 mol %) of the structural units derived from the monomers. If the content of the structural unit derived from the crosslinkable monomer is 1 to 20 mol, particles having a stable shape can be obtained.

Examples of the additional monomer include diene compounds such as butadiene, isoprene, dimethylbutadiene, chloroprene, and 1,3-pentadiene; unsaturated nitrile compounds such as (meth)acrylonitrile, α-chloroacrylonitrile, α-chloromethylacrylonitrile, α-methoxyacrylonitrile, α-ethoxyacrylonitrile, crotonitrile, cinnamonitrile, itaconitrile, maleonitrile, and fumaronitrile; unsaturated amides such as (meth) acrylamide, dimethyl(meth)acrylamide, N,N'-methylenebis (meth)acrylamide, N,N'-ethylenebis(meth)acrylamide, N,N'-hexamethylenebis(meth)acrylamide, N-hydroxymethyl (meth)acrylamide, N-(2-hydroxyethyl)(meth)acrylamide, N,N-bis(2-hydroxyethyl)(meth)acrylamide, crotonamide, and cinnamamide; (meth)acrylates such as methyl(meth) acrylate, ethyl(meth)acrylate, propyl(meth)acrylate, butyl (meth)acrylate, hexyl(meth)acrylate, lauryl(meth)acrylate, polyethylene glycol (meth)acrylate, and polypropylene glycol (meth)acrylate; aromatic vinyl compounds such as styrene, α-methylstyrene, o-methoxystyrene, p-hydroxystyrene, and p-isopropenylphenol; epoxy group-containing unsaturated compounds such as epoxy(meth)acrylate obtained by reacting a diglycidyl ether of bisphenol A, diglycidyl ether of glycol, or the like with (meth)acrylic acid, a hydroxyalkyl(meth)acrylate, or the like, a urethane (meth) acrylate obtained by reacting a hydroxyalkyl(meth)acrylate with a polyisocyanate, glycidyl (meth)acrylate, and (meth) allyl glycidyl ether; amino group-containing unsaturated compound such as dimethylamino(meth)acrylate and diethylamino(meth)acrylate; and the like. Among these, diene compounds, styrene, and acrylonitrile are preferable, and butadiene is particularly preferable. These additional monomers may be used individually or in combination.

The content of the structural unit derived from the additional monomer in the crosslinked particles (F2) is preferably 10 to 80 mass %, more preferably 30 to 80 mass %, and still more preferably 50 to 80 mass %, based on the total amount (=100 mol %) of the structural units derived from the monomers. If the content of the structural unit derived from the additional monomer is less than 10 mol %, a decrease in elongation may occur. If the content of the structural unit derived from the additional monomer exceeds 80 mol %, the patterning capability may deteriorate due to a decrease in dispersibility in an alkaline developer.

These crosslinked particles (F2) may be used either individually or in combination.

The copolymer included in the crosslinked particles (F2) preferably has a glass transition temperature (Tg) of 20° C. or less, more preferably 10° C. or less, and still more preferably 0° C. or less (the lower limit of the glass transition temperature is normally −70° C.). If the glass transition temperature (Tg) of the crosslinked particles (F2) exceeds 20° C., cracks may occur in the resulting cured product (e.g., insulating film), or the cured product may exhibit decreased elongation.

The crosslinked particles (F2) are copolymer particles. The average particle size of the crosslinked particles (F2) is not particularly limited, but is preferably 30 to 500 nm, more preferably 40 to 200 nm, and still more preferably 50 to 120 nm. The particle size of the crosslinked particles (F2) may be adjusted (controlled) by an arbitrary method. For example, when producing (synthesizing) the crosslinked particles by emulsion polymerization, the particle size of the crosslinked particles may be adjusted by controlling the number of micelles during emulsion polymerization by adjusting the amount of emulsifier.

The average particle size of the crosslinked particles (F2) refers to a value determined by diluting a dispersion of the crosslinked particles by a known method, and measuring the particle size of the crosslinked particles using a light scattering particle size analyzer ("LPA-3000" manufactured by Otsuka Electronics Co., Ltd.).

The content of the crosslinked particles (F2) is preferably 1 to 200 parts by mass, more preferably 1 to 150 parts by mass, and still more preferably 1 to 100 parts by mass, based on 100 parts by mass of the block copolymer (A). If the content of the crosslinked particles (F2) is less than 1 part by mass, cracks may occur in the resulting insulating film or the like, or a decrease in elongation may occur. If the content of the crosslinked particles (F2) exceeds 200 parts by mass, a residue of the crosslinked particles (F2) may occur during development, so that the patterning capability may deteriorate.

Additives

The photosensitive insulating resin composition according to one embodiment of the invention may optionally include additives insofar as the properties of the photosensitive insulating resin composition are not impaired.

Examples of additives used for the negative-tone resin composition include an inorganic filler, a sensitizer, a quencher, a leveling agent (surfactant), and the like.

Examples of additives used for the positive-tone resin composition include a heat-sensitive acid generator, a sensitizer, a leveling agent (surfactant), and the like.

The heat-sensitive acid generator is not particularly limited insofar as the heat-sensitive acid generator is a compound that generates an acid upon heating. The acid generated by the heat-sensitive acid generator promotes a reaction between the block copolymer (A) and the functional group (e.g., alkyl ether group) of the crosslinking agent (B). Examples of the heat-sensitive acid generator include onium salt compounds and the like.

The leveling agent improves the applicability of the resin composition. Examples of the leveling agent include, but are not limited to, nonionic leveling agents such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenol ether and polyoxyethylene nonyl phenol ether, a polyoxyethylene-polyoxypropylene block copolymer, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

Examples of commercially available products of the leveling agent include fluorine-containing leveling agents such as EFTOP EF301, EFTOP EF303, EFTOP EF352 (manufactured by Tohkem Products Corporation), Megafac F171, Megafac F172, Megafac F173 (manufactured by DIC Corporation), Fluorad FC430, Fluorad FC431 (manufactured by Sumitomo 3M Ltd.), Asahi Guard AG710, Surflon S-381, Surflon S-382, Surflon SC101, Surflon SC102, Surflon SC103, Surflon SC104, Surflon SC105, Surflon SC106, Surfynol E1004, Surfynol KH-10, Surfynol KH-20, Surfynol KH-30, Surfynol KH-40 (manufactured by Asahi Glass Co., Ltd.), Ftergent 250, Ftergent 251, Ftergent 222F, Ftergent FTX-218 (manufactured by NEOS Co., Ltd.), organosiloxane polymer-based leveling agents such as KP341, X-70-092, X-70-093 (manufactured by Shin-Etsu Chemical Co., Ltd.), SH8400 (manufactured by Dow Corning Toray Co., Ltd.), acrylic acid or methacrylic acid-based leveling agents such as Polyflow No. 75, Polyflow No. 77, Polyflow No. 90, Polyflow No. 95 (manufactured by Kyoeisha Chemical Co., Ltd.), and the like.

These leveling agents may be used individually or in combination.

The leveling agent is preferably added in an amount of 50 to 1000 ppm, and more preferably 100 to 800 ppm (i.e., the concentration in a solution that includes the resin composition). If the concentration of the leveling agent is less than 50 ppm, the composition may not be uniformly applied to an uneven substrate. If the concentration of the leveling agent exceeds 1000 ppm, adhesion may decrease during development and after curing.

Production Method

The negative-tone or positive-tone photosensitive insulating resin composition according to one embodiment of the invention may be produced by a known method. The photosensitive insulating resin composition may also be produced by charging a sample bottle with each component, sealing the sample bottle, and stirring the mixture on a wave rotor.

[2] Cured Product

The cured product according to one embodiment of the invention is obtained by curing the photosensitive insulating resin composition according to one embodiment of the invention.

(2-1) Cured Product of Negative-Tone Photosensitive Insulating Resin Composition A cured product of the negative-tone photosensitive insulating resin composition according to one embodiment of the invention exhibits excellent electrical insulating properties, thermal shock resistance, and the like. An insulating film (i.e., cured product) produced using the negative-tone photosensitive insulating resin composition according to one embodiment of the invention exhibits a high residual ratio, excellent resolution, and the like. Therefore, the cured product may suitably used as a surface protective film, a planarization film, and an interlayer dielectric of electronic parts (e.g., semiconductor device and semiconductor package), a photosensitive adhesive, a pressure-sensitive adhesive, and the like.

A cured product of the negative-tone photosensitive insulating resin composition may be obtained as follows, for example. Specifically, the negative-tone photosensitive insulating resin composition is applied to a support (e.g., resin-coated copper foil, copper-clad laminate, silicon wafer provided with a metal sputtering film, or alumina substrate), and dried to vaporize the solvent and the like to form a film. The film is then exposed via a desired mask pattern, and heated (hereinafter referred to as "post-exposure bake (PEB)") to promote a reaction between the block copolymer (A) and the crosslinking agent (B). The film is then developed using an alkaline developer so that the unexposed area is dissolved and removed to form a desired pattern. The pattern is then heated to provide the film with insulating properties.

The resin composition may be applied to the support by dipping, spraying, bar coating, roll coating, spin coating, or the like. The thickness of the film may be appropriately controlled by selecting the application (coating) method, the solid content and the viscosity of the resin composition solution, and the like.

Examples of radiation used for exposure include ultraviolet rays, electron beams, laser beams, and the like emitted from a low-pressure mercury lamp, a high-pressure mercury lamp, a metal halide lamp, a g-line stepper, an h-line stepper, an i-line stepper, a KrF stepper, an ArF stepper, an EB exposure system, and the like. The dose may be appropriately selected depending on the light source, the thickness of the resin film, and the like. For example, when applying ultraviolet rays emitted from a high-pressure mercury lamp, the dose may be set to about 100 to 20,000 mJ/m$^2$ when forming a resin film having a thickness of 1 to 50 μm.

The exposed film is normally subjected to PEB in order to promote a reaction between the block copolymer (A) and the crosslinking agent (B) due to the generated acid. The PEB conditions are determined depending on the amount of the negative-tone photosensitive insulating resin composition, the thickness of the film, and the like. PEB is normally performed at 70 to 150° C., and preferably 80 to 120° C. for about 1 to 60 minutes. The film is then developed using an alkaline developer so that the unexposed area is dissolved and removed to form a desired pattern. The film may be developed by shower development, spray development, immersion development, paddle development, or the like. The film is normally developed at 20 to 40° C. for about 1 to 10 minutes.

The alkaline developer may be an alkaline aqueous solution prepared by dissolving an alkaline compound (e.g., sodium hydroxide, potassium hydroxide, aqueous ammonia, tetramethylammonium hydroxide, or choline) in water at a concentration of 1 to 10 mass %, for example. An appropriate amount of a water-soluble organic solvent (e.g., methanol or ethanol), a surfactant, and the like may be added to the alkaline aqueous solution. The film developed using the alkaline developer is washed with water, and then dried.

After development, the film may be sufficiently cured by heating so that the film exhibits sufficient insulating properties. The curing conditions are not particularly limited. The film may be cured at 50 to 250° C. for about 30 minutes to 10 hours depending on the application of the cured product. The film may be heated in a plurality of stages so that the film is cured sufficiently or deformation of the pattern does not occur. For example, the film may be heated (cured) at 50 to 120° C. for about 5 minutes to 2 hours in the first stage, and heated (cured) at 80 to 250° C. for about 10 minutes to 10 hours in the second stage. When using such curing conditions, an oven, an infrared furnace, or the like may be used.

Figure 1:
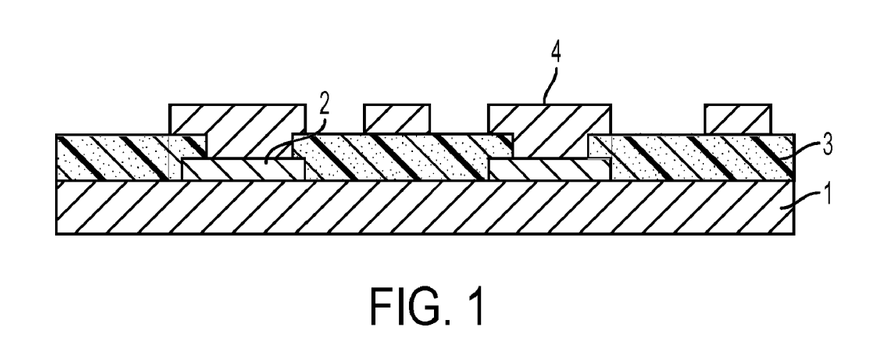
FIG. 1 is a schematic view showing a cross section of a semiconductor device.
Figure 2:
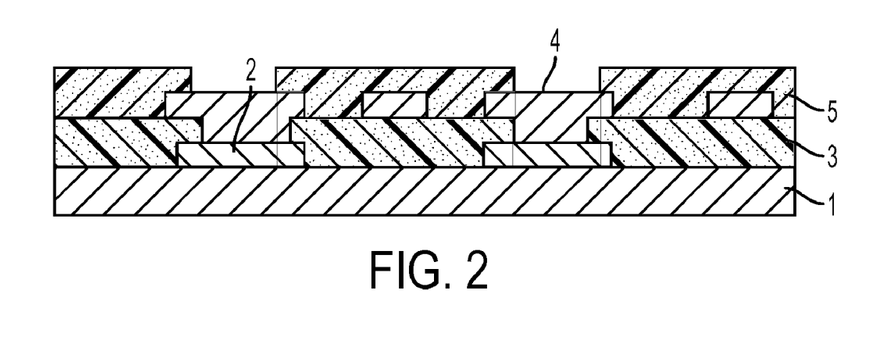
FIG. 2 is a schematic view showing a cross section of a semiconductor device.

An electronic part such as a semiconductor device (element) (i.e., a substrate on which a circuit is formed) shown in FIGS. 1 and 2 can be produced by utilizing the negative-tone photosensitive insulating resin composition according to one embodiment of the invention. Specifically, metal pads 2 are formed on a substrate 1. A cured insulating film 3 is then formed in a pattern using the resin composition, and a metal wire 4 is formed in a pattern to obtain a substrate shown in FIG. 1 on which a circuit is formed. A cured insulating film 5 may be formed on the substrate to obtain a substrate shown in FIG. 2 on which a circuit is formed.

(2-2) Cured Product of Positive-Tone Photosensitive Insulating Resin Composition Since the positive-tone photosensitive insulating resin composition according to one embodiment of the invention exhibits excellent resolution, adhesion, thermal shock resistance, electrical insulating properties, patterning capability, elongation, and the like, a cured product of the positive-tone photosensitive insulating resin composition may be suitably used as a surface protective film, a planarization film, and an interlayer dielectric of electronic parts (e.g., circuit board (semiconductor device) and semiconductor package), an insulating film material for a high-density assembly, a photosensitive adhesive, a pressure-sensitive adhesive, and the like. The cured product may be particularly suitable as an interlayer dielectric or a planarization film of a circuit board.

A cured product of the positive-tone photosensitive insulating resin composition may be obtained as follows, for example. Specifically, the negative-tone photosensitive insulating resin composition is applied to a support (e.g., resin-coated copper foil, copper-clad laminate, silicon wafer provided with a metal sputtering film, or alumina substrate), dried to vaporize the solvent and the like to form a film. The film is then exposed via a desired mask pattern, and normally heated (hereinafter referred to as "post-exposure bake (PEB)"). The film is then developed using an alkaline developer so that the exposed area is dissolved and removed to form a desired pattern. The pattern is then heated to provide the film with insulating properties.

The resin composition may be applied to the support by dipping, spraying, bar coating, roll coating, spin coating, curtain coating, or the like. The thickness of the film may be appropriately controlled by selecting the application (coating) method, the solid content and the viscosity of the resin composition solution, and the like.

Examples of radiation used for exposure include ultraviolet rays, electron beams, laser beams, and the like emitted from a low-pressure mercury lamp, a high-pressure mercury lamp, a metal halide lamp, a g-line stepper, an i-line stepper, a KrF stepper, an ArF stepper, an EB exposure system, and the like. The dose may be appropriately selected depending on the light source, the thickness of the resin film, and the like. For example, when applying ultraviolet rays emitted from a high-pressure mercury lamp, the dose may be set at about 1000 to 20,000 mJ/m$^2$ when the applied film has a thickness of 5 to 50 μm.

The film is then developed using an alkaline developer so that the exposed area is dissolved and removed to form a desired pattern. The film may be developed by shower development, spray development, immersion development, paddle development, or the like. The film is normally developed at 20 to 40° C. for about 1 to 10 minutes. The alkaline developer may be an alkaline aqueous solution prepared by dissolving an alkaline compound (e.g., sodium hydroxide, potassium hydroxide, aqueous ammonia, tetramethylammonium hydroxide, or choline) in water at a concentration of 1 to 10 mass %, for example. An appropriate amount of a water-soluble organic solvent (e.g., methanol or ethanol), a surfactant, and the like may be added to the alkaline aqueous solution. The film developed using the alkaline developer is washed with water, and then dried.

After development, the film may be sufficiently cured by heating so that the film exhibits sufficient insulating properties. The curing conditions are not particularly limited. The film may be cured at 100 to 250° C. for about 30 minutes to 10 hours depending on the application of the cured product. The film may be heated in a plurality of stages so that the film is cured sufficiently or deformation of the pattern does not occur. For example, the film may be heated (cured) at 50 to 100° C. for about 10 minutes to 2 hours in the first stage, and heated (cured) at 100 to 250° C. for about 20 minutes to 8 hours in the second stage. When using such curing conditions, an oven, an infrared furnace, or the like may be used.

An electronic part such as a circuit board (semiconductor device) shown in FIGS. 1 and 2 can be produced by utilizing the positive-tone photosensitive insulating resin composition according to one embodiment of the invention. Specifically, metal pads 2 are formed on a substrate 1. A cured insulating film 3 is then formed in a pattern using the resin composition, and a metal wire 4 is formed in a pattern to obtain a circuit board shown in FIG. 1. A cured insulating film 5 may be formed on the substrate to obtain a circuit board shown in FIG. 2.

EXAMPLES

The embodiment of the invention is further described below by way of examples.

[1] Production of Block Copolymer

Production Example 1

A pressure bottle was charged with a methylene chloride solution of 4-hydroxystyrene under a nitrogen stream. The solution was then cooled to −78° C. 4-Hydroxystyrene was subjected to cationic polymerization by adding HI—ZnI$_2$. (cationic polymerization catalyst) to the solution with stirring in an amount of 1/500 mol based on 1 mol of 4-hydroxystyrene. After confirming that the conversion rate (reaction rate) of 4-hydroxystyrene had reached 98% or more by the TSC method, ethyl vinyl ether was added to the reaction system under a nitrogen stream, and subjected to living cationic block copolymerization for 8 hours. The temperature of the resulting polymer solution was gradually increased to room temperature. A 5-fold volume of methanol was added to the polymer solution to coagulate and collect the block copolymer produced. The block copolymer was purified by reprecipitation, and dried at 50° C. for 1 day under reduced pressure to obtain a copolymer (A-1).

The composition of the copolymer (A-1) was analyzed by $^{13}$C-NMR. The copolymer (A-1) was an ABA block copolymer in which a block including the structural unit (a1) derived from 4-hydroxystyrene was bonded to each end of a block including the structural unit (a2) derived from ethyl vinyl ether. The content of the structural unit (a1) derived from 4-hydroxystyrene was 60 mol %, and the content of the structural unit (a2) derived from ethyl vinyl ether was 40 mol % (total content of structural units (a1) and (a2)=100 mol %). The polystyrene-reduced weight average molecular weight of the copolymer (A-1) determined by GPC was 30,000, and the ratio (Mw/Mn) (molecular weight distribution) of the weight average molecular weight (Mw) to the number average molecular weight (Mn) of the copolymer (A-1) was 3.5.

The $^{13}$C-NMR analysis was performed using a system "JNM-EX270" (manufactured by JEOL Ltd.). The Mw and the Mn of the copolymer were measured using a GPC system "HLC-8220GPC" (manufactured by Tosoh Corp.). Specifically, the Mw of the copolymer was measured by GPC using columns (G2000HXL×2, G3000HXL×1, G4000HXL×1) at a flow rate of 1.0 ml/min and a column temperature of 40° C. (eluant: tetrahydrofuran, standard: monodisperse polystyrene). The molecular weight distribution (Mw/Mn) was calculated from the Mw and Mn measurement results. Production Examples 2 and 3 and Comparative Production Examples 1 and 2

Production Example 2

An ABA block copolymer in which a block including the structural unit (a1) derived from 4-hydroxystyrene was bonded to each end of a block including the structural unit (a2) derived from propyl vinyl ether was produced in the same manner as in Production Example 1, except for using propyl vinyl ether instead of ethyl vinyl ether. The resulting copolymer is referred to as "copolymer (A-2)". The copolymer (A-2) was analyzed in the same manner as in Production Example 1. The copolymer (A-2) had a content of the structural unit (a1) derived from 4-hydroxystyrene of 60 mol %, and a content of the structural unit (a2) derived from propyl vinyl ether of 40 mol %. The copolymer (A-2) had a polystyrene-reduced weight average molecular weight of 30,000, and a molecular weight distribution of 3.5.

Production Example 3

An ABA block copolymer in which a block including the structural unit (a1) derived from 4-hydroxystyrene was bonded to each end of a block including the structural unit (a2) derived from ethyl vinyl ether was produced in the same manner as in Production Example 1, except for changing the amounts of 4-hydroxystyrene and ethyl vinyl ether. The resulting copolymer is referred to as "copolymer (A-3)". The copolymer (A-3) was analyzed in the same manner as in Production Example 1. The copolymer (A-3) had a content of the structural unit (a1) derived from 4-hydroxystyrene of 50 mol %, and a content of the structural unit (a2) derived from ethyl vinyl ether of 50 mol %. The copolymer (A-3) had a polystyrene-reduced weight average molecular weight of 10,000, and a molecular weight distribution of 3.5.

Comparative Production Example 1 p-t-butoxystyrene and ethyl vinyl ether (100 parts by mass in total (molar ratio: 60:40)) were dissolved in 150 parts by mass of propylene glycol monomethyl ether. The mixture was polymerized at 70° C. for 10 hours in a nitrogen atmosphere in the presence of 4 parts by mass of azobisisobutyronitrile. After the addition of sulfuric acid to the reaction solution, the components were reacted at 90° C. for 10 hours to convert (deprotect) p-t-butoxystyrene into 4-hydroxystyrene. After the addition of ethyl acetate to the resulting copolymer, the mixture was washed five times with water. After isolating the ethyl acetate phase, the solvent was removed to obtain a random copolymer (4-hydroxystyrene/ethyl vinyl ether copolymer) (hereinafter referred to as "copolymer (AR-1)"). The copolymer (AR-1) was analyzed in the same manner as in Production Example 1. The copolymer (AR-1) had a content of the structural unit (ar1) derived from 4-hydroxystyrene of 60 mol %, and a content of the structural unit (ar2) derived from ethyl vinyl ether of 40 mol %. The copolymer (AR-1) had a polystyrene-reduced weight average molecular weight of 30,000, and a molecular weight distribution of 3.5.

Comparative Production Example 1

An ABA block copolymer in which a block including the structural unit (ar1) derived from styrene was bonded to each end of a block including the structural unit (ar2) derived from ethyl vinyl ether was produced in the same manner as in Production Example 1, except for using styrene instead of ethyl vinyl ether. The resulting copolymer is referred to as "copolymer (AR-2)". The copolymer (AR-2) was analyzed in the same manner as in Production Example 1. The copolymer (AR-2) had a content of the structural unit (ar1) derived from 4-hydroxystyrene of 60 mol %, and a content of the structural unit (ar2) derived from styrene of 40 mol %. The copolymer (AR-2) had a polystyrene-reduced weight average molecular weight of 30,000, and a molecular weight distribution of 3.5.

[2] Production of Negative-Tone Photosensitive Insulating Resin Composition

Example 1

100 parts by mass of the copolymer (A-1), 15 parts by mass of a crosslinking agent (B-1), 5 parts by mass of a crosslinking agent (B-2), 1 part by mass of a photosensitive compound (C-1), 3 parts by mass of an adhesion improver (E-1), and 0.1 parts by mass of a surfactant (G-1) were dissolved in 150 parts by mass of a solvent (D-1) (see Table 1) to obtain a negative-tone photosensitive insulating resin composition.

Examples 2 to 6 and Comparative Examples 1 to 3

The copolymer, the crosslinking agent, the acid generator, the solvent, the adhesion improver, and the surfactant shown in Table 1 were mixed in a mass ratio shown in Table 1 to obtain a negative-tone photosensitive insulating resin composition.

In Example 5, 5 parts by mass of a phenolic low-molecular-weight compound (phenol compound (a-1)) was used in addition to the above components. In Example 6, 5 parts by mass of crosslinked particles (F-1) were used in addition to the above components.

C-2: 4-(phenylthio)phenyldiphenylsulfonium tris(pentafluoroethyl)trifluorophosphate ("CPI-210S" manufactured by San-Apro Ltd.)
(D) Solvent
D-1: ethyl lactate
(E) Adhesion Improver
E-1: γ-glycidoxypropyltrimethoxysilane ("S-510" manufactured by Chisso Corporation)
(F) Crosslinked Particles
F-1: butadiene/styrene/hydroxybutyl methacrylate/methacrylic acid/divinylbenzene copolymer (=60/20/12/6/2 (mass %), average particle size: 65 nm)
(G) Surfactant
G-1: "FTX-218" manufactured by NEOS Co., Ltd.

[3] Production of Positive-Tone Photosensitive Insulating Resin Composition

Example 7

100 parts by mass of the copolymer (A-1), 10 parts by mass of a crosslinking agent (B-1), 10 parts by mass of a crosslinking agent (B-2), 25 parts by mass of a quinone diazide group-

TABLE 1

| | Copolymer (parts) | Phenol compound (parts) | Crosslinking agent (parts) | Acid generator (parts) | Adhesion improver (parts) | Crosslinked particles (parts) | Surfactant (parts) | Solvent (parts) |
|---|---|---|---|---|---|---|---|---|
| Example 1 | A-1: 100 | — | B-1: 15<br>B-2: 5 | C-1: 1 | E-1: 3 | — | G-1: 0.1 | D-1: 150 |
| Example 2 | A-2: 100 | — | B-1: 15<br>B-2: 5 | C-1: 1 | E-1: 3 | — | G-1: 0.1 | D-1: 150 |
| Example 3 | A-3: 100 | — | B-1: 15<br>B-2: 5 | C-1: 1 | E-1: 3 | — | G-1: 0.1 | D-1: 150 |
| Example 4 | A-1: 100 | — | B-3: 20<br>B-4: 20 | C-2: 2 | E-1: 3 | — | G-1: 0.1 | D-1: 150 |
| Example 5 | A-1: 90 | a-1: 5 | B-1: 15<br>B-2: 5 | C-1: 1 | E-1: 3 | — | G-1: 0.1 | D-1: 150 |
| Example 6 | A-1: 100 | — | B-1: 15<br>B-2: 5 | C-1: 1 | E-1: 3 | F-1: 5 | G-1: 0.1 | D-1: 150 |
| Comparative Example 1 | AR-1: 100 | — | B-1: 15<br>B-2: 5 | C-1: 1 | E-1: 3 | — | G-1: 0.1 | D-1: 150 |
| Comparative Example 2 | AR-2: 100 | — | B-1: 15<br>B-2: 5 | C-1: 1 | E-1: 3 | — | G-1: 0.1 | D-1: 150 |
| Comparative Example 3 | AR-2: 100 | — | B-3: 20<br>B-4: 20 | C-2: 2 | E-1: 3 | — | G-1: 0.1 | D-1: 150 |

The details of the components shown in Table 1 other than the copolymer are as follows.
(a) Phenol Compound
a-1: 1,1-bis(4-hydroxyphenyl)-1-{4-[1-(4-hydroxyphenyl)-1-methylethyl]phenyl}ethane
(B) Crosslinking Agent
B-1: hexamethoxymethylated melamine ("Cymel 300" manufactured by Mitsui-Cytec, Ltd.)
B-2: propylene glycol diglycidyl ether ("Epolight 70P" manufactured by Kyoeisha Chemical Co., Ltd.)
B-3: pentaerythritol glycidyl ether ("Denacol EX411" manufactured by Nagase ChemteX Corp.)
B-4: 1,4-bis{[(3-ethyloxetan-3-yl)methoxy]methyl}benzene ("OXT-121" manufactured by Toagosei Co., Ltd.)
(C) Photoacid Generator (Photosensitive Compound)
C-1: 2-[2-(furan-2-yl)ethenyl]-4,6-bis(trichloromethyl)-s-triazine ("TFE-Triazine" manufactured by Sanwa Chemical Co., Ltd.)

containing compound (C-3), 3 parts by mass of an adhesion improver (E-2), and 0.1 parts by mass of a surfactant (G-1) were dissolved in 150 parts by mass of a solvent (D-1) (see Table 2) to obtain a positive-tone photosensitive insulating resin composition.

Examples 7 to 13 and Comparative Examples 4 and 5

The copolymer, the crosslinking agent, the quinone diazide group-containing compound, the solvent, the adhesion improver, and the surfactant shown in Table 2 were mixed in a mass ratio shown in Table 2 to obtain a positive-tone photosensitive insulating resin composition.

In Example 11, 5 parts by mass of a phenolic low-molecular-weight compound (phenol compound (a-1)) was used in addition to the above components. In Example 12, 5 parts by mass of crosslinked particles (F-1) were used in addition to the above components.

TABLE 2

| | Copolymer (parts) | Phenol compound (parts) | Crosslinking agent (parts) | Quinone diazide group-containing compound (parts) | Adhesion improver (parts) | Crosslinked particles (parts) | Surfactant (parts) | Solvent (parts) |
|---|---|---|---|---|---|---|---|---|
| Example 7 | A-1: 100 | — | B-1: 10<br>B-5: 10 | C-3: 25 | E-2: 3 | — | G-1: 0.1 | D-1: 150 |
| Example 8 | A-2: 100 | — | B-1: 10<br>B-5: 10 | C-3: 25 | E-2: 3 | — | G-1: 0.1 | D-1: 150 |
| Example 9 | A-3: 100 | — | B-1: 10<br>B-5: 10 | C-3: 25 | E-2: 3 | — | G-1: 0.1 | D-1: 150 |
| Example 10 | A-1: 100 | — | B-1: 10<br>B-2: 5 | C-4: 30 | E-2: 3 | — | G-1: 0.1 | D-1: 150 |
| Example 11 | A-1: 90 | a-1: 5 | B-1: 10<br>B-5: 10 | C-3: 25 | E-2: 3 | — | G-1: 0.1 | D-1: 150 |
| Example 12 | A-1: 100 | — | B-1: 10<br>B-5: 10 | C-3: 25 | E-2: 3 | F-1: 5 | G-1: 0.1 | D-1: 150 |
| Example 13 | A-1: 100 | — | B-2: 5<br>B-5: 10 | C-3: 25 | E-3: 3 | — | G-1: 0.1 | D-1: 100 |
| Comparative Exmple 4 | AR-1: 100 | — | B-1: 10<br>B-5: 10 | C-3: 25 | E-2: 3 | — | G-1: 0.1 | D-1: 150 |
| Comparative Example 5 | AR-2: 100 | — | B-1: 10 | C-3: 25 | E-2: 3 | — | G-1: 0.1 | D-1: 150 |

The details of the components shown in Table 2 other than the copolymer are as follows.
(a) Phenol Compound
a-1: 1,1-bis(4-hydroxyphenyl)-1-{4-[1-(4-hydroxyphenyl)-1-methylethyl]phenyl}ethane
(B) Crosslinking Agent
B-1: hexamethoxymethylated melamine ("Cymel 300" manufactured by Mitsui-Cytec, Ltd.)
B-2: propylene glycol diglycidyl ether ("Epolight 70P" manufactured by Kyoeisha Chemical Co., Ltd.)
B-3: pentaerythritol glycidyl ether ("Denacol EX411" manufactured by Nagase ChemteX Corp.)
B-5: phenol-dicyclopentadiene epoxy resin ("XD-1000" manufactured by Nippon Kayaku Co., Ltd.)
(C) Quinone Diazide Group-Containing Compound (Photosensitive Compound)
C-3: quinone diazide sulfonate (2.0 mol condensate) obtained by esterification of 1,1-bis(4-hydroxyphenyl)-1-[4-[1-(hydroxyphenyl)-1-methylethyl]phenyl]ethane and 1,2-naphthoquinonediazido-5-sulfonic acid
C-4: quinone diazide sulfonate (1.5 mol condensate) obtained by esterification of 1,1-bis(4-hydroxyphenyl)-1-ethane and 1,2-naphthoquinonediazido-5-sulfonic acid
(D) Solvent
  D-1: ethyl lactate
(E) Adhesion Improver
E-2: 1,3,5-N-tris(trimethoxysilylpropyl)isocyanurate ("Y-11597" manufactured by Momentive Performance Materials)
E-3: γ-glycidoxypropyltrimethoxysilane ("S-510" manufactured by Chisso Corporation)
(F) Crosslinked Particles
F-1: butadiene/styrene/hydroxybutyl methacrylate/methacrylic acid/divinylbenzene copolymer (=60/20/12/6/2 (mass %), average particle size: 65 nm)
(G) Surfactant
G-1: "FTX-218" manufactured by NEOS Co., Ltd.
[4] Evaluation of Photosensitive Insulating Resin Composition
The properties of the negative-tone photosensitive insulating resin compositions of Examples 1 to 6 and Comparative Examples 1 to 3 and the positive-tone photosensitive insulating resin compositions of Examples 7 to 13 and Comparative Examples 4 and 5 were evaluated by the following methods.

Figure 3:
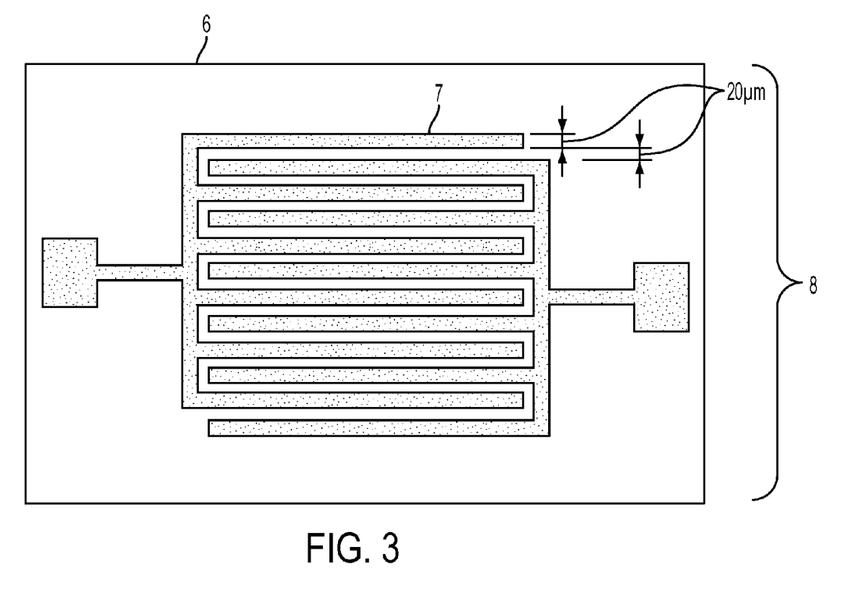
FIG. 3 is a schematic view showing an evaluation substrate used to evaluate electrical insulating properties.

The results are shown in Table 3 (Examples 1 to 6 and Comparative Examples 1 to 3) and Table 4 (Examples 7 to 13 and Comparative Examples 4 and 5).
(1) Resolution
The photosensitive insulating resin composition was spin-coated onto a 6-inch silicon wafer, and heated at 110° C. for 3 minutes using a hot plate to form a uniform resin film having a thickness of 20 μm. The resin film was exposed to ultraviolet rays (wavelength: 365 nm) emitted from a high-pressure mercury lamp via a pattern mask (1:1 line-and-space mask) using an aligner ("MA-100" manufactured by Karl Suss) so that the dose at a wavelength of 365 nm was 500 mJ/cm$^2$. The resin film was then subjected to PEB at 110° C. for 3 minutes using a hot plate, and developed at 23° C. for 120 seconds in a 2.38 mass % tetramethylammonium hydroxide aqueous solution. The minimum dimension of the resulting pattern was evaluated as the resolution.
(2) Stress in Insulating Film
The photosensitive insulating resin composition was spin-coated onto an 8-inch silicon wafer, and heated at 110° C. for 3 minutes using a hot plate to form a uniform resin film having a thickness of 20 μm. The resin film was exposed to ultraviolet rays emitted from a high-pressure mercury lamp using an aligner ("MA-100" manufactured by Karl Suss) so that the dose at a wavelength of 365 nm was 500 mJ/cm$^2$. The resin film was then subjected to PEB at 110° C. for 3 minutes using a hot plate, and developed at 23° C. for 120 seconds in a 2.38 mass % tetramethylammonium hydroxide aqueous solution. The resin film was then cured at 190° C. for 1 hour using a convection oven to form an insulating film. The difference in stress in the substrate before and after forming the insulating film was determined using a stress analyzer ("FLX-2320-s" manufactured by TOHO Technology (transferred from KLA-Tencor)).
(3) Electrical Insulating Properties
The photosensitive insulating resin composition was applied to an evaluation substrate 8 (see FIG. 3) having a copper foil pattern 7 (thickness: 10 μm) on a substrate 6, and heated at 110° C. for 3 minutes using a hot plate to obtain a substrate having a resin film (the thickness of the resin film on the copper foil 7 was 10 μm). The resin film was then cured at 190° C. for 1 hour using a convection oven to form an insulating film. The substrate 8 was placed in a migration evaluation system ("AEI, EHS-221MD" manufactured by Tabai Espec Corp.), and processed for 200 hours at a temperature of 121° C., a humidity of 85%, a pressure of 1.2 atm, and an applied voltage of 5 V. The resistance (Ω) of the test substrate was measured to evaluate the insulating properties.

TABLE 3

| | Resolution | Stress in insulating film | Electrical insulating properties |
|---|---|---|---|
| Example 1 | 10 μm | 10 MPa | $1 \times 10^{12}$ |
| Example 2 | 10 μm | 10 MPa | $1 \times 10^{12}$ |
| Example 3 | 10 μm | 10 MPa | $1 \times 10^{12}$ |
| Example 4 | 10 μm | 10 MPa | $1 \times 10^{12}$ |
| Example 5 | 10 μm | 10 MPa | $1 \times 10^{12}$ |
| Example 6 | 10 μm | 10 MPa | $1 \times 10^{12}$ |
| Comparative Example 1 | 50 μm | 10 MPa | $1 \times 10^{12}$ |
| Comparative Example 2 | 10 μm | 25 MPa | $1 \times 10^{12}$ |
| Comparative Example 3 | 10 μm | 25 MPa | $1 \times 10^{12}$ |

TABLE 4

| | Resolution | Stress in insulating film | Electrical insulating properties |
|---|---|---|---|
| Example 7 | 10 μm | 10 MPa | $1 \times 10^{12}$ |
| Example 8 | 10 μm | 10 MPa | $1 \times 10^{12}$ |
| Example 9 | 10 μm | 10 MPa | $1 \times 10^{12}$ |
| Example 10 | 10 μm | 10 MPa | $1 \times 10^{12}$ |
| Example 11 | 10 μm | 10 MPa | $1 \times 10^{12}$ |
| Example 12 | 10 μm | 10 MPa | $1 \times 10^{12}$ |
| Example 13 | 10 μm | 10 MPa | $1 \times 10^{12}$ |
| Comparative Example 4 | 50 μm | 10 MPa | $1 \times 10^{12}$ |
| Comparative Example 5 | 10 μm | 25 MPa | $1 \times 10^{12}$ |

As is clear from the results shown in Tables 3 and 4, the insulating films obtained in Examples 1 to 13 showed a small stress, and exhibited excellent resolution and electrical insulating properties.

According to the embodiment of the present invention, since the photosensitive insulating resin composition includes a specific block copolymer, it is possible to obtain a cured product (e.g., insulating film) that exhibits excellent resolution, electrical insulating properties, and the like while sufficiently suppressing warping of a substrate when producing an insulating film.

If the content of the structural unit (a1) is 40 to 60 mol % based on the total amount (=100 mol %) of the structural unit (a1) and the structural unit (a2), excellent alkali developability is achieved while sufficiently reducing stress in the resulting insulating film.

If the polystyrene-reduced weight average molecular weight of the block copolymer (A) determined by gel permeation chromatography is 10,000 to 50,000, the resulting insulating film exhibits improved resolution, thermal shock resistance, heat resistance, residual ratio, and the like.

If the photosensitive insulating resin composition includes the adhesion improver (E), the cured product (e.g., insulating film) exhibits improved adhesion to a substrate.

If the photosensitive insulating resin composition includes the crosslinked particles (F), the cured product exhibits improved durability, thermal shock resistance, and the like.

If the crosslinking agent (B) is at least one compound selected from (b1) a compound that includes two or more alkyl-etherified amino groups in its molecule, (b2) an oxirane ring-containing compound, and (b3) an oxetanyl ring-containing compound, and the photosensitive compound (C) is a photoacid generator (i.e., the composition is a negative-tone photosensitive insulating resin composition), a negative-tone pattern can be formed. In this case, a cured product (e.g., insulating film) that exhibits excellent resolution, electrical insulating properties, and the like can be produced while sufficiently suppressing warping of a substrate when forming an insulating film.

If the photoacid generator is a hydroxyl group-containing onium salt, a reaction between the crosslinking agent (B) and the block copolymer (A) or the phenolic low-molecular-weight compound is promoted, so that a negative-tone pattern can be easily formed.

If the photosensitive compound (C) is a quinone diazide group-containing compound (i.e., the composition is a positive-tone photosensitive insulating resin composition), a positive-tone pattern can be formed. In this case, a cured product (e.g., insulating film) that exhibits excellent resolution, electrical insulating properties, and the like can be produced while sufficiently suppressing warping of a substrate when forming an insulating film.

If the crosslinking agent (B) is at least one of (b1) a compound that includes two or more alkyl-etherified amino groups in its molecule, and (b2) an oxirane ring-containing compound, excellent alkali-developability can be obtained while sufficiently reducing stress in the resulting insulating film.

A cured product obtained by curing the above photosensitive insulating resin composition exhibits excellent resolution, electrical insulating properties, and the like.

Obviously, numerous modifications and variations of the present invention are possible in light of the above teachings. It is therefore to be understood that within the scope of the appended claims, the invention may be practiced otherwise than as specifically described herein.

The invention claimed is:

1. A photosensitive insulating resin composition comprising:
a block copolymer comprising:
a first structural unit shown by a following formula (1); and
a second structural unit shown by a following formula (2);
a crosslinking agent;
a photosensitive compound; and
a solvent, wherein $R^1$ represents a hydrogen atom or an alkyl group having 1 to 4 carbon atoms, and $R^2$ represents an alkyl group having 1 to 4 carbon atoms, and wherein the block copolymer is an ABA block copolymer comprising a first block including a first structural unit shown by formula (1), and a second block including a second structural unit shown by formula (2), the first block bonded to each end of the second block.

2. The photosensitive insulating resin composition according to claim 1,
wherein the block copolymer has a polystyrene-reduced weight average molecular weight determined by gel permeation column chromatography of about 10,000 to about 50,000.

3. The photosensitive insulating resin composition according to claim 1,
wherein a content of the first structural unit in the photosensitive insulating resin composition is about 40 to about 60 mol % based on a total amount (=100 mol %) of the first structural unit and the second structural unit.

4. The photosensitive insulating resin composition according to claim 1, further comprising:
an adhesion improver.

5. The photosensitive insulating resin composition according to claim 1, further comprising:
crosslinked particles.

6. The photosensitive insulating resin composition according to claim 1,
wherein the crosslinking agent comprises at least one of a first compound including two or more alkyl-etherified amino groups in molecule of the first compound, an oxirane ring-containing compound, and an oxetanyl ring-containing compound,
wherein the photosensitive compound comprises a photoacid generator, and
wherein the photosensitive insulating resin composition comprises a negative-tone photosensitive insulating resin composition.

7. The photosensitive insulating resin composition according to claim 6,
wherein the photoacid generator comprises a hydroxyl group-containing onium salt.

8. The photosensitive insulating resin composition according to claim 1,
wherein the photosensitive compound comprises a quinonediazide group-containing compound, and
wherein the photosensitive insulating resin composition comprises a positive-tone photosensitive insulating resin composition.

9. The photosensitive insulating resin composition according to claim 8,
wherein the crosslinking agent comprises at least one of a second compound including two or more alkyl-etherified amino groups in molecule of the second compound, and an oxirane ring-containing compound.

10. A cured product obtained by curing the photosensitive insulating resin composition according to claim 1.

11. An ABA block copolymer comprising:
a first block including a first structural unit shown by a following formula (1); and
a second block including a second structural unit shown by a following formula (2), the first block being bonded to each end of the second block, wherein $R^1$ represents a hydrogen atom or an alkyl group having 1 to 4 carbon atoms, and $R^2$ represents an alkyl group having 1 to 4 carbon atoms.

12. The photosensitive insulating resin composition according to claim 2,
wherein a content of the first structural unit in the photosensitive insulating resin composition is about 40 to about 60 mol % based on a total amount (=100 mol %) of the first structural unit and the second structural unit.

13. The photosensitive insulating resin composition according to claim 2, further comprising:
an adhesion improver.

14. The photosensitive insulating resin composition according to claim 3, further comprising:
an adhesion improver.

15. The photosensitive insulating resin composition according to claim 12, further comprising:
an adhesion improver.

16. The photosensitive insulating resin composition according to claim 2, further comprising:
crosslinked particles.

17. The photosensitive insulating resin composition according to claim 3, further comprising:
crosslinked particles.

18. The photosensitive insulating resin composition according to claim 4, further comprising:
crosslinked particles.

19. The photosensitive insulating resin composition according to claim 12, further comprising:
crosslinked particles.

20. The photosensitive insulating resin composition according to claim 13, further comprising:
crosslinked particles.

* * * * *